United States Patent [19]
Southard

[11] 4,454,498
[45] Jun. 12, 1984

[54] ADJUSTABLE ATTENUATION MEMBER FOR A DIGITAL TELECOMMUNICATIONS SYSTEM

[75] Inventor: Gary D. Southard, Coral Springs, Fla.

[73] Assignee: Siemens Aktiengesellschaft, Berlin & Munich, Fed. Rep. of Germany

[21] Appl. No.: 40,705

[22] Filed: May 21, 1979

[51] Int. Cl.³ .............................................. H03K 13/00
[52] U.S. Cl. .............................. 340/347 DD; 364/715
[58] Field of Search ................ 340/347 DD; 235/310; 364/715, 757

[56] References Cited
U.S. PATENT DOCUMENTS 3,863,248  1/1975  Deschenes et al. ......... 340/347 DD

OTHER PUBLICATIONS

Degryse, "IEEE Transactions on Computers", vol. C-21, No. 11, Nov. 1972, pp. 1165–1168.

Primary Examiner—C. D. Miller
Attorney, Agent, or Firm—Hill, Van Santen, Steadman & Simpson

[57] ABSTRACT

A digital telecommunications system having an adjustable attenuation member incorporates first and second memories for altering the values of different pulse code modulated words, representing different amplitude values of transmitted waves, such as tone frequencies. One of the memories alters the first three amplitude bit values of a special pulse code modulated word to alter the values for example in six-dB steps. The other memory defines the values of smaller steps. The change of the output code from the first memory and the determination of the characteristic to be output by the second memory is dependent upon control signals from a control unit.

1 Claim, 1 Drawing Figure

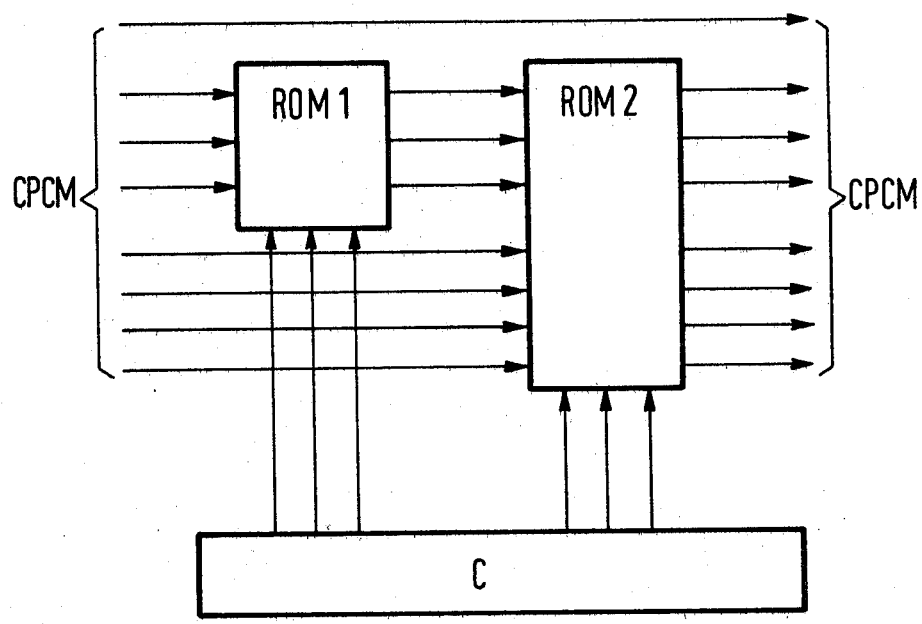

ADJUSTABLE ATTENUATION MEMBER FOR A DIGITAL TELECOMMUNICATIONS SYSTEM

BACKGROUND

1. Field of the Invention

The present invention relates to adjustable attenuation devices, and more particularly to such devices employed in digital telecommunications systems such as telephone exchange systems.

2. The Prior Art

Adjustable attenuation devices are known, as shown in British Pat. No. 1,325,193. As disclosed therein, an amplification or attenuation of a tone frequency is carried out by an amplitude multiplier unit so that a nominal loudness level of the respective tone is attained. Such a tone may be transmitted to a subsequent compander and to a parallel-to-series converter. The amplification factor of the multiplier unit is variable and controlled by an amplification control. The multiplier unit contains a very extensive conversion table, to accommodate a variety of amplitudes of the tone frequencies to be present and to allow for their output in the same form. If a less extensive conversion table is employed, only relatively few amplification factors may be provided.

BRIEF DESCRIPTION OF THE INVENTION

It is a principal object of the present invention to provide an adjustable digital attenuation device which is capable of regulating attenuation and amplification values in relatively small steps. It is a further object of the present invention to provide such a device in which the steps may be made of approximately one-dB steps, so that the attenuation member is able to achieve a regulation of the attenuation factor, in any desired degree of precision.

In one embodiment of the present invention, the several bits of each amplitude-designating word are presented in bit-parallel fashion. One bit of each word identifies the polarity of the word, and this bit is not changed. The high order bits of the word are applied to a first memory device, in order to produce an output indicative of a new amplitude value. The low order bits are connected to a second memory, which is preferably a read-only memory for altering them in such a way as to control the attenuation factor in very small steps, by altering the bit value of the amplitude designating word optionally, for executing a companding function.

Because the attenuation member is subdivided into two components, each of them with one memory and in which the major control is effected by the first component with the first memory, it is possible in many instances to dispense with the fine subdivision provided by the second memory, with the result that the conversion process is considerably simplified.

In a more specific embodiment of the invention, the first memory incorporates a shift register, and the high order bits are shifted to the right or left in order to modify the amplitude by the factor of 2 for each unit of shifting. In this way, the attenuation is controlled in intervals of precisely six-dB.

Because the conversion tables stored in the memories are constructed to respond to fewer inputs than all of the bits of the words, the conversion tables can be substantially smaller and require considerably less storage capacity.

These and other objects and advantages of the present invention will become manifest by an inspection of the accompanying drawing and the following description.

BRIEF DESCRIPTION OF THE DRAWING

Reference will now be made to the accompanying drawing, which illustrates in functional block diagram form an illustrative embodiment of the present invention.

DESCRIPTION OF THE PREFERRED EMBODIMENT

Compression characteristics are illustrated and described for example in Chatelon et al U.S. Pat. No. 3,575,591. FIG. 2 of the Chatelon patent illustrates a compression characteristic with thirteen segments.

Referring now to the drawing, a previously companded pulse code modulated word CPCM arrives at the apparatus from an external source, in bit-parallel fashion. The coded signals applied to the CPCM input comprise eight bit binary coded words corresponding to individual amplitude values. The code word has eight bits, of which the first bit identifies the sign. This bit is represented by the uppermost line in the drawing, and the signal present on this line is unaffected by the attenuation member of the present invention.

The three most significant bits of the CPCM word, which define the segments in the compression curve, are applied to inputs of a first memory ROM 1, which is controlled in its operation by a control unit C. ROM 1 produces an output on three lines, which lines are applied to three inputs of a second memory ROM 2, and the least significant four bits of the CPCM words which define the locations in the segments defined by the first three bits, are applied directly to the ROM 2.

ROM 2 is also controlled by the control unit C, and produces bits on a plurality of output lines which correspond to the new amplitude value, in response to the incoming data bits and the control unit C.

A typical companding characteristic curve is explained in U.S. Pat. No. 3,575,591, which describes a system in which PCM words are companded. The PCM words are binary-coded words, symmetrical with respect to the zero level, so that the first bit indicates the polarity of the signal and the other bits constitute a binary-coded indication of the signals' amplitude.

Both of the read-only memory units ROM 1 and ROM 2 are provided with a plurality of storage locations, which are addressed or accessed by the incoming data bits, and by the signals supplied from the control unit C. The data stored at the storage locations which are accessed is read out on the output lines of the memory. This data is identical to the address when no modification is required, and different from the address when amplification or attenuation is required. For any given combination of incoming data bits, and signals on the control lines, there is a predetermined combination of signals produced on the output lines of the read-only memory. Since the construction and operation of read-only memories is well-known in the art, they need not be described in detail herein. An illustration of the co-operation between the control unit and the read-only memories is described, for example, in British Pat. No. 1,325,193.

The signals on the lines controlling the memories ROM 1 and ROM 2 from the control unit C may respond to a variety of factors, such as the required amplitude or amplification factors or attenuation factors. These signals are generated and stored within the control unit C.

The three most significant bits applied to ROM 1 together indicate the segment of the characteristic curve of the modification function which corresponds to the amplitude value represented by the incoming data bits. The four lower order bits designate the intervals within a segment, respectively. The three outputs of the ROM 1 therefore are representative of segments of the characteristic curve, and different outputs from ROM 1 result in the displacement from segment-to-segment along the characteristic curve. When the characteristic curve includes a compander function, it is logarithmic, and preferably changes by a factor of 2 for each successive segment. In many situations, controlling the amplitude by merely factors which are powers of 2 will suffice in itself. However, if fine correction is also required beyond factors which are powers of 2, it can be accomplished through additional conversion provided by the read-only memory ROM 2. When the first memory ROM 1 provides outputs differing by intervals of 6-dB, the second memory ROM 2 is able to achieve attenuation steps of less than 1-dB, which meets any requirements of telecommunication systems. In the drawing, each input line and each output line corresponds to a bit. The four lower order lines in the drawing are the four lowest order bits. More or fewer bits may be utilized, depending upon the degree of precision required.

In operation, the outputs of the read-only memory ROM 2 is provided to other equipment (not shown) in the telephone exchange, for further processing. Such equipment is shown and described in Schimmel U.S. Pat. No. 4,105,873.

If desired, the first memory ROM 1 may be embodied by a shift register. The most significant three bits of the incoming word are entered in parallel into three stages of the shift register, and the shift register may then be shifted in one direction or another under control of signals from the control unit C. In order to reduce the amplitude represented by the contents of the shift register, by a factor of 2, each bit is shifted one step to the right. Shifting by one step to the left, the amplitude is increased by a factor of 2. Accordingly, a shift register is able to produce outputs which are representative of amplitudes which differ from each other by factors which are powers of 2. This may be expressed as N×6-dB, where N is the number of steps shifted.

When the shift register shifts its contents to the right, a lower order bit is shifted out of the shift register. In this event, the lower order bit is connected by a line (not shown) to the control unit C, in order to influence the operation of the control unit in controlling the read-only memory ROM 2. In a case where two or more bits are shifted out of the shift register, a subsidiary shift register may be provided to accept the shifted-out bits, and provide signals on plural lines to the control unit C, for effecting a compensating control in the operation of ROM 2.

When the data is not previously companded, the read-only memory ROM 2 preferably accomplishes a companding function with respect to the data supplied to it, both directly from the input and through the ROM 1 or shift register in this way, the output of ROM 2 is a companded PCM word.

The apparatus of the present invention makes it possible to provide attenuation values in intervals of less than one-dB. In systems in which such fine control is not required, less memory capacity is required for the ROM 2 unit. It should be understood that programmable ROM units cand be used for either of the read-only memory units illustrated in the drawing, and if desired, an erasable ROM may also be employed, to allow changing of the coding of the ROM units when desired. If random output values are required, for special coding purposes, it is possible to achieve them in a systematic way by coding the memories by altering the values for the segments and/or intervals of the modification characteristic curve.

It will be apparent that other modifications and additions may be made in the subject matter of the present invention without departing from the essential features and novelty thereof, which are intended to be defined and secured by the appended claims.

What is claimed is:

1. In an adjustable attenuation device for altering the amplitude of a signal, the amplitude of said signal being represented by a digital word in bit-parallel fashion, the combination comprising, a first memory having a plurality of storage locations and a plurality of address inputs for receiving signals identifying individual ones of said storage locations, means for connecting said address inputs to receive a first plurality of bits from said digital word, said first memory storing at each of said storage locations a stored word representing an amplitude level, said first memory having a plurality of outputs and being adapted to produce on said outputs signals corresponding to the stored word stored at the storage location identified by signals at the address inputs of said first memory, and a second memory having a plurality of storage locations and a plurality of address inputs for receiving signals identifying individual ones of said storage locations, means for connecting some of said address inputs to said outputs of said first memory and for connecting others of said address inputs to receive a second plurality of bits from said digital word, said second memory storing at each of said storage locations a stored word representing an amplitude level, said second memory having a plurality of outputs and being adapted to produce on said outputs signals corresponding to the stored word stored at the storage location identified by signals at the address inputs of said second memory.

* * * * *